United States Patent
Haartsen et al.

[19]

[11] Patent Number: 6,124,764
[45] Date of Patent: Sep. 26, 2000

[54] STABLE LOW-POWER OSCILLATOR

[75] Inventors: Jaap Haartsen, Borne, Netherlands; Bojko Marholev, Lund, Sweden

[73] Assignee: Telefonaktiebolaget LM Ericsson, Stockholm, Sweden

[21] Appl. No.: 09/236,008

[22] Filed: Jan. 22, 1999

[51] Int. Cl.[7] .................................................. H03K 3/26
[52] U.S. Cl. ........................... 331/111; 331/143; 327/106
[58] Field of Search ................................... 327/159, 160, 327/106; 331/175, 143, 74, 144, 145, 117 R, 111, 1 R, 16, 34, 41, 44

[56] References Cited

U.S. PATENT DOCUMENTS

| | | | |
|---|---|---|---|
| 4,525,685 | 6/1985 | Hesselberth et al. | 331/10 |
| 4,533,880 | 8/1985 | Geurts | 331/1 A |
| 4,864,253 | 9/1989 | Zwack | 331/1 A |
| 5,424,664 | 6/1995 | Phillips | 327/106 |
| 5,473,284 | 12/1995 | Jantti et al. | 331/10 |
| 5,488,645 | 1/1996 | Mori et al. | 377/20 |
| 5,943,613 | 8/1999 | Wendelrup et al. | 455/343 |

FOREIGN PATENT DOCUMENTS

| | | |
|---|---|---|
| 62-35278 | 2/1987 | Japan . |
| 2007450 | 5/1979 | United Kingdom . |
| 2252879 | 8/1992 | United Kingdom . |

*Primary Examiner*—Benny Lee
*Assistant Examiner*—Kimberly E Glenn
*Attorney, Agent, or Firm*—Burns, Doane, Swecker & Mathis, L.L.P.

[57] ABSTRACT

A method for calibrating a frequency device by monitoring its output cycles over a first plurality of monitoring windows is disclosed. An accumulation of these monitored cycles is used to determine a correction for the device over a second plurality of monitoring windows. A method for obtaining fractional correction values to be applied for controlling the frequency device is also disclosed.

33 Claims, 6 Drawing Sheets

STABLE LOW-POWER OSCILLATOR

FIELD OF THE INVENTION

The invention relates to battery powered units and more particularly, to a method for maintaining the accuracy of a clock within these units while minimizing power consumption.

BACKGROUND

Many devices include a real-time clock, ranging from wristwatches used for displaying the time of day to more complex intelligent devices that schedule activities based on the time of day. In most devices, an inaccuracy of the clock is treated as a minor inconvenience which is addressed by adjusting the clock as needed in order to accommodate for drift and aging. However, for certain systems that rely on time-of-day scheduling, accuracy is extremely critical. This is especially true in systems composed of several units each with its own clock, which interact with each other and schedule their mutual activities based on their clocks. Mutual drift in the clocks will misalign the activities and prevent interactions. For example, in the wireless frequency-hopping communications system as described in U.S. patent application No. 08/932,911 filed Sep. 18, 1997 for Contemporaneous Connectivity To Multiple Piconets by J. C. Haartsen, each unit has its own native system clock. This native clock schedules the wake-up and sleep intervals during standby mode, as well as the hop frequency to which the unit will tune to during the wake-up period. Another unit that desires to make contact with the sleeping unit can speed up the acquisition considerably by knowing the native clock of the unit in standby mode and predicting its scheduling. Once connected, the two units exchange their current native clock values. The clock differences are stored in both units as clock offsets. These offset values can then be used on a later occasion when these two units want to connect again. The stored offset added to the unit's native clock gives an estimate to the native clock value of the other unit.

Due to a drift in the clocks caused by, for example, temperature variations and aging, the stored offset values only have a limited lifetime. The accuracy of the estimate becomes smaller when time elapses and no connection is made. Therefore, the more stable the clocks (less drift), the longer these units remain synchronized without having to interact with each other. This relates to a faster acquisition when interaction is desired.

For the real-time or time-of-day clock, long-term stability is important. Its behavior over a short-term (milliseconds) or medium-term (seconds to minutes) is not critical. For accurate clocks, crystal references are usually applied. These crystals, included in an oscillator, give a clock a stability on the order 5 to 20 parts per million (ppm) over a 50 degree temperature range. However, these oscillators consume quite some power and are preferably turned off when possible. All computing and communication devices include a crystal reference. However, this reference is turned off during sleep and suspend modes in order to minimize the power consumption. This is especially true for portable devices such as, for example, laptops and wireless terminals.

Low-power oscillators that draw little current run, preferably, at low frequencies. Crystal oscillators are less appropriate for this application due to the high frequencies and higher power consumption. For low-power oscillators, preferably, LC or relaxation oscillators are used. These oscillators can run at low frequencies, can be integrated on a chip and consume very little power. However, these low-power oscillators (LPO) are not that stable. A common way to improve the long-term stability of an LPO is to calibrate it frequently using the crystal (reference) oscillator when the crystal oscillator is active. So, for example, in the standby mode, the crystal oscillator can be powered on periodically to calibrate the LPO. Preferably, this is carried out when the unit wakes up for other activities, like scanning for example, during which time the crystal oscillator is in an active state. Since the crystal oscillator is only used at a very low duty cycle (which may correspond to the wake-up period scheduled for other activities), power consumption is limited while having a higher long-term stability than could be achieved with the LPO alone.

Figure 1:
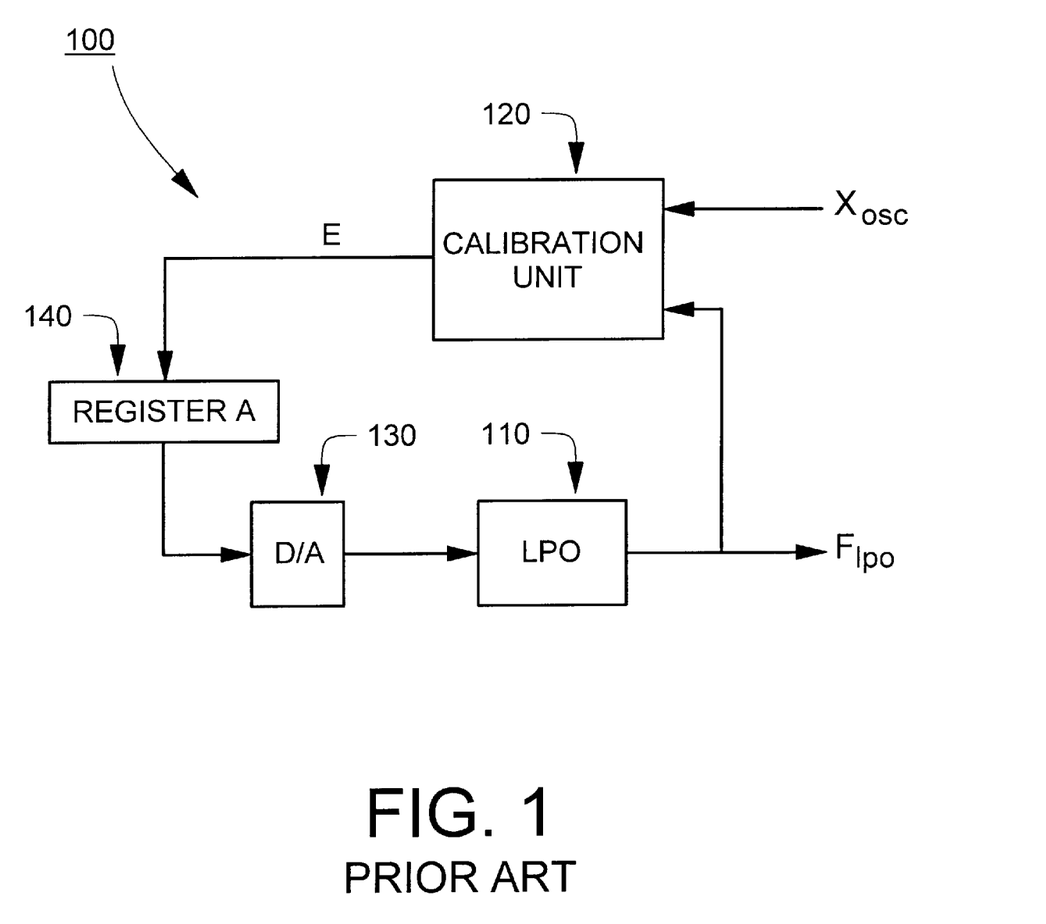
FIG. 1 illustrates a conventional low-power oscillator (LPO) and calibration logic circuit.

There are several methods for calibrating a LPO. In most modern devices, this occurs digitally. During the calibration, the LPO is compared to the crystal reference clock in a digital circuit and a correction signal is fed back to the LPO. Tuning the LPO 110 occurs through an analog signal; therefore, a digital-to-analog (D/A) converter 130 between the digital calibration circuitry 120 and a LPO 110 is required as illustrated in FIG. 1. This conventional circuit is described in more detail below. The correction signal E, represented as a binary word, is stored in a register 140 which is updated at each calibration event.

The long-term stability of the circuit of FIG. 1, however, is limited by two factors. First, the resolution of the D/A converter 130 limits the accuracy of the correction signal E. The analog input to the LPO 110 can only change in discrete steps as determined by the least significant bit (LSB) of the D/A converter 130. The resolution of a D/A converter is limited by the technology applied. The minimum step size is determined by the desired tuning range and the resolution. Due to process variations, the tuning range of an LPO must be rather large. In addition, a D/A converter with more than 9 bits becomes impractical. Therefore, the LPO long-term stability is limited to a few hundred ppm. Improving the accuracy of the crystal oscillator or calibrating more frequently does not appreciably increase the LPO stability.

Another factor that limits the stability of the LPO is the accuracy of the calibration method. Calibration can be carried out by counting the number of reference cycles N of the reference clock during a time window which is controlled by the LPO. The deviation of N from the desired value $N_{ref}$ determines the correction signal. The resolution of the correction signal is $1/N_{ref}$. $N_{ref}$ is determined by the frequency $f_{ref}$ of the reference oscillator and by the length of the calibration window $T_{wake}$:

$$N_{ref} = f_{ref} * T_{wake}$$

For a stability on the order of a few ppm, $N_{ref}$ has to be on the order of $10^6$. The reference frequency $f_{ref}$ is determined by the type of crystal reference used; $T_{wake}$ is determined by the calibration period and may be limited by the wake-up procedure used during the standby mode. That is, in the standby mode, the unit may wake up periodically for short periods Twake in order to scan for paging messages. In order to reduce acquisition time, wireless systems wake up rather frequently for short periods of time than for a longer time period less frequently. Therefore, $T_{wake}$ is preferably small. However, a small $T_{wake}$ results in a low LPO accuracy.

What is needed, therefore, is a method for obtaining a better long-term stability of a LPO that is calibrated by a crystal oscillator while also minimizing the power consumption.

SUMMARY

The long-term stability of a LPO can be increased by separating the signal monitoring and the signal correcting operations in the calibration process. The LPO output signal is monitored during a number of monitoring windows M. These windows preferably correspond to the wake-up periods in the standby mode of the host system that the LPO is part of. During wake-up periods, other activities such as page scanning, for example, may take place. The results of the monitoring process are accumulated. Based on the accumulated result derived from M monitoring windows, a decision for the correction scheme is determined for the next period encompassing another M monitoring windows. The correction signal is constant in the interval between two monitoring windows but can change from one interval to the other interval. As a result, the correction signal is not constant during the period encompassing M monitoring windows, but its average over this period renders a correction signal which has an improved accuracy by a factor of M. The LPO accuracy is further improved by toggling the (digital) correction signal, which can only be presented by discrete values, between two or more discrete values. This concept is similar to fractional-N synthesizers where the integer division factor toggles between two (or more) integer values to get a fractional division factor.

The combination of accumulating over multiple monitoring windows and the toggling of the correction value between two discrete values improves the long-term stability of the LPO. However, instead of improving the stability, the method can also be used to reduce the power consumption by reducing the monitor window length or it can be used to reduce the resolution (i.e., complexity and power consumption) of the D/A converter controlling the LPO.

BRIEF DESCRIPTION OF THE DRAWINGS

These and other objects, features and advantages of the present invention will be readily apparent to one skilled in the art from the following written description, read in conjunction with the drawings, in which.

DETAILED DESCRIPTION

The basic operation of a periodically calibrated LPO is illustrated in FIG. 1. A conventional LPO 110, e.g. a relaxation oscillator, is controlled by a calibration circuit 120. Periodically, the calibration unit determines a correction signal E based on the LPO output and a reference signal $X_{osc}$. The signal E, which is represented by a binary word, is stored in register 140 and when output, is converted to an analog control signal in D/A converter 130 controlling LPO 110 which outputs an operating frequency $F_{LPO}$. The D/A converter is indicated here explicitly, but can be part of the tank circuit of the LPO. That is, the tank of the relaxation-type LPO is implemented as a capacitor bank in which capacitors can be switched in or out directly by the binary word to control the frequency of the LPO.

Figure 2:
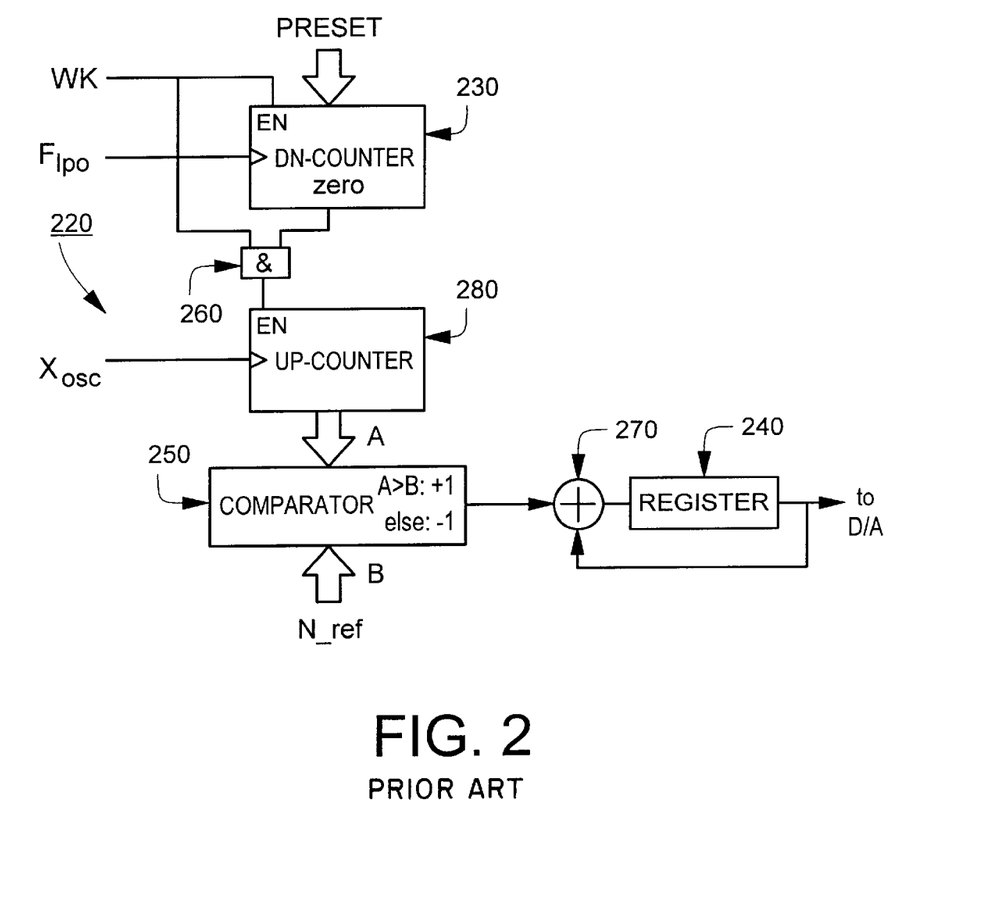
FIG. 2 illustrates the calibration logic for the circuit of FIG. 1.

During the sleep period, $X_{osc}$ and calibration unit 120 are powered down. The LPO keeps running using the control signal as stored in register 140. A more detailed example of the calibration logic 120 is depicted in FIG. 2. A down-counter 230 is pre-loaded with a value representing the number of LPO cycles in one wake-up (i.e., monitor) period. At wake-up, the counter 230 is enabled by a wake-up signal WK and starts counting down at the LPO rate. The up-counter 280 is enabled as long as the WK is high and the content of the down-counter 230 is not zero. Once enabled, the up-counter 280 counts at the $X_{osc}$ rate. The output A of the up-counter 280 is fed to a comparator 250 where it is compared with a reference value $N_{ref}$. At the end of the monitoring window, when the down-counter 230 reaches zero, the comparison between the content of the up-counter 280 and the reference value $N_{ref}$ is used to determine whether the control value in control register 240 was too high or too low. The value stored in register 240 is adjusted accordingly to reduce the difference. It is reduced if the control value is high or increased if the control value is low.

Figure 3:
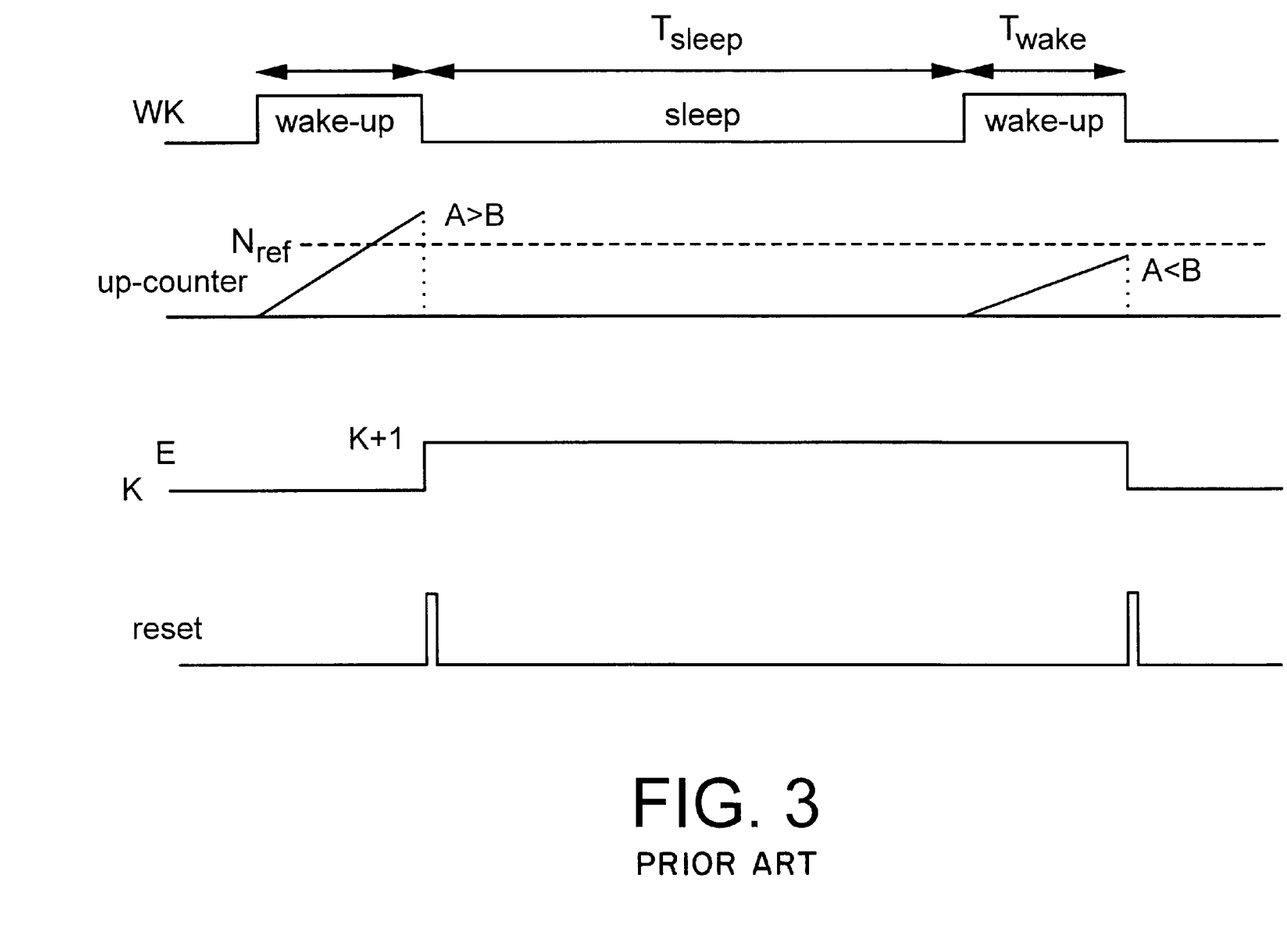
FIG. 3 illustrates a timing diagram for the operation of the conventional calibrated LPO.

Referring to FIG. 3, the calibration circuitry and reference oscillator are periodically woken up for a duration of $T_{wake}$ to re-calibrate the LPO. During this time, the up-counter 280 is enabled and its content increases linearly with time. At the end of the wake-up period, the content of the control register is incremented if the difference is negative and decremented if the difference is positive. This approach assumes that a large control word will result in an increased LPO frequency. The counters are reset as well. In the example illustrated in FIG. 3, the correction value E in register 240 switches between k and k+1.

The conventional method described with reference to FIGS. 1 to 3 has its limitations when it comes to long-term stability. First of all, the integer value $N_{ref}$ limits the resolution of the calibration process. The stability is limited to $1/N_{ref}$. Since $N_{ref}$ represents the number of reference cycles counted during $T_{wake}$, the long-term stability S cannot be better than:

$$S \leq 1/(f_{ref} \times T_{wake})$$

If, for example, the reference frequency is 1 Mhz and the wake-up period is 10 ms, the stability is limited to 100 ppm. But, in addition to the calibration method, the limited accuracy in the LPO tuning limits the stability. The resolution of the D/A converter determines the resolution of the frequency control of the LPO. As an example, a LPO frequency of 3.2 kHz is assumed. To accommodate for process variation and tolerances, a tuning range of around +/−400 Hz is required. With a 9-bit D/A converter, the resolution is then around 1.6 Hz. This limits the accuracy to about +/−250 ppm. Note that in addition to this stability, the stability of the crystal reference oscillator has to be taken into account, which may add 5–20 ppm. This is minimal with respect to the inaccuracy caused by the limitations of the calibration method and the control of the LPO.

Figure 4:
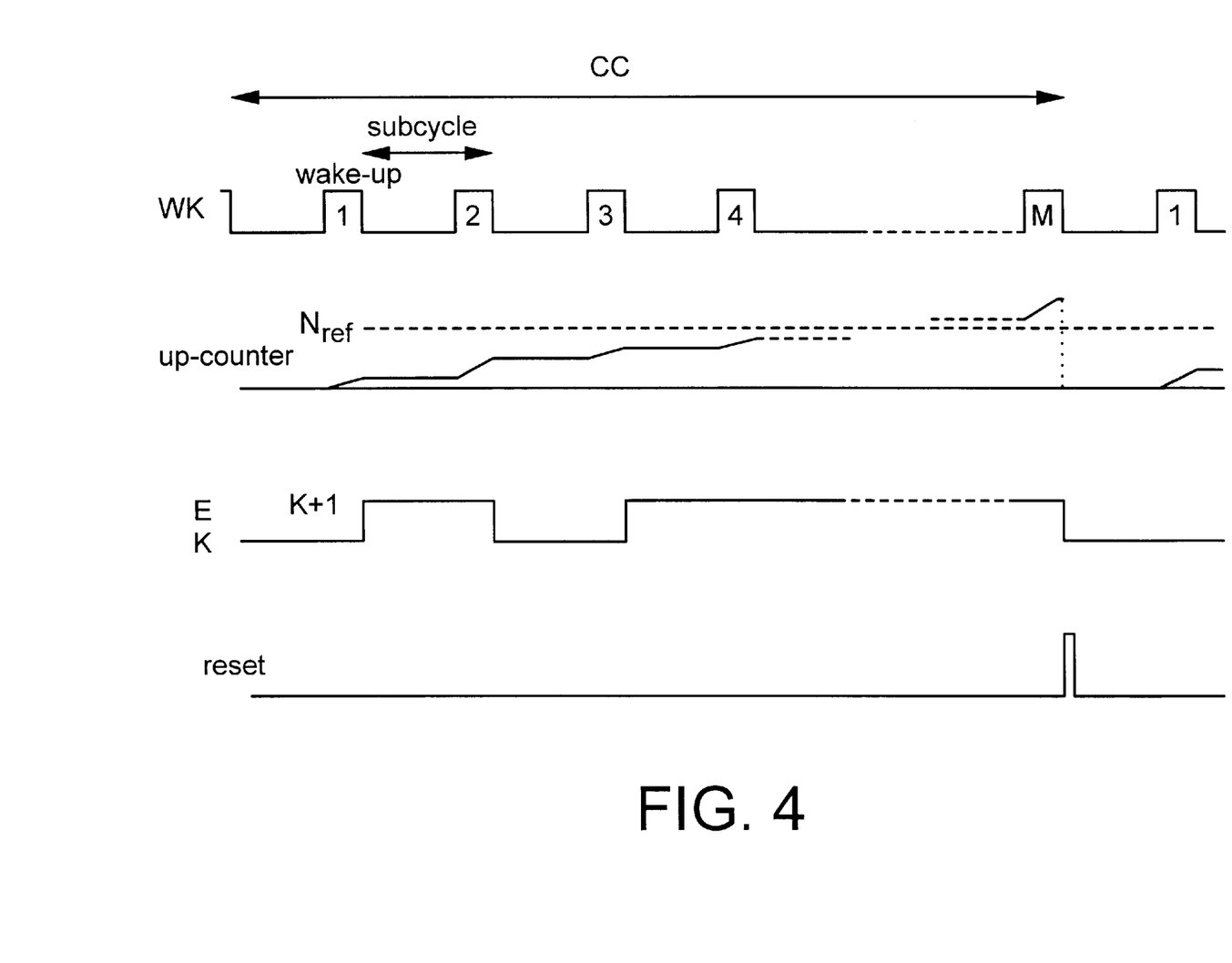
FIG. 4 illustrates a timing diagram illustrating the operation of a calibrated LPO according to an exemplary embodiment of the present invention.

According to the present invention, the stability of the LPO is improved by increasing both $N_{ref}$ and the tuning accuracy of the LPO. The basic idea is illustrated in FIG. 4. A number of M wake-up windows and M sleep periods are combined into a calibration cycle CC. One sleep period and one wake-up period together comprise a subcycle. There are M subcycles in a calibration cycle. During the calibration cycle, unlike the prior calibration method, the up-counter is not reset; its contents are accumulated during the M consecutive wake-up periods (monitoring windows). As a result, the integer $N_{ref}$ is increased M times from $f_{ref} \times T_{wake}$ to $M \times f_{ref} \times T_{wake}$. As a result, the accuracy is increased by a factor of M. In addition, the correction value E is constant during a subcycle, but does not have to be constant from subcycle to subcycle. The correction value can change from subcycle to subcycle, even if the subcycles belong to the same calibration cycle. In this way, the stability of the LPO is determined by the average of the correction value E over the calibration cycle, rather than by the instantaneous correction value E itself. The pattern in which the value E should change over the next calibration cycle is determined at the end of the current calibration cycle and depends on the difference between the accumulated value N and the desired value $N_{ref}$. For those skilled in the art of synthesizers, it will be clear that the technique applied here resembles the technique used in fractional-N synthesizers. Although the frequency can, in principle, only change in discrete steps due to the integer division factor N in the feedback loop of the PLL, fractional steps can be obtained by toggling between two (or more) integer division factors, thus providing a fractional division factor. For the LPO, the output frequency $F_{LPO}$ will not be constant during the calibration cycle, as illustrated in FIG. 4. However, the average can come much closer to the desired value. Since, for the LPO, only long term stability is an issue, the deviations over a short time period are less of a concern. With this method, the accuracy of the LPO tuning is improved by a factor of M as well.

The following example illustrates this concept. Assume, that a LPO has a resolution of D Hz. The LPO frequency is F0+i*D where F0 is the lower boundary of the tuning range and i is an integer. Assume further that the desired average frequency for the LPO is F1 and (F1−F0)/D is not an integer; that is, no i can be found such that F1=F0+i*D. Assume that F1=F0+10.1*D. If M is chosen to be 10, an average LPO frequency of F1 can be obtained by using during a calibration cycle of M=10 subcycles, 9 times F0+10*D and one time F0+11*D. On average, this results in a LPO frequency of:

$F_{LPO}=(9*(F0+10*D)+(F0+11*D))/10=F0+10.1*D$, which was the desired frequency.

Stated another way, in FIG. 4, this is accomplished by changing the control value E appropriately during the calibration cycle. E is a binary control word which can only have integer values. In the example illustrated by FIG. 4, it is assumed that E ranges from 0 to $2^W-1$ where W is the word length of the D/A converter. One step in E corresponds to D Hz at the output of the LPO. Suppose E with a value of k corresponds to a LPO frequency of F0+10*D, then E with a value of k+1 corresponds to a LPO frequency of F0+11*D. If E is toggled between k and k+1, on average, a fractional value for E is obtained that is between k and k+1. If, in the illustrated example, E is chosen as k for 9 subcycles and k+1 for one subcycle, its average over the calibration cycle will be k+0.1 which corresponds to an average LPO frequency of {[9*(F0+10*D)]+[F0+11*D]}/10 which may be expressed as [10*F0+101*D]/10 or F0+10.1*D.

Figure 5:
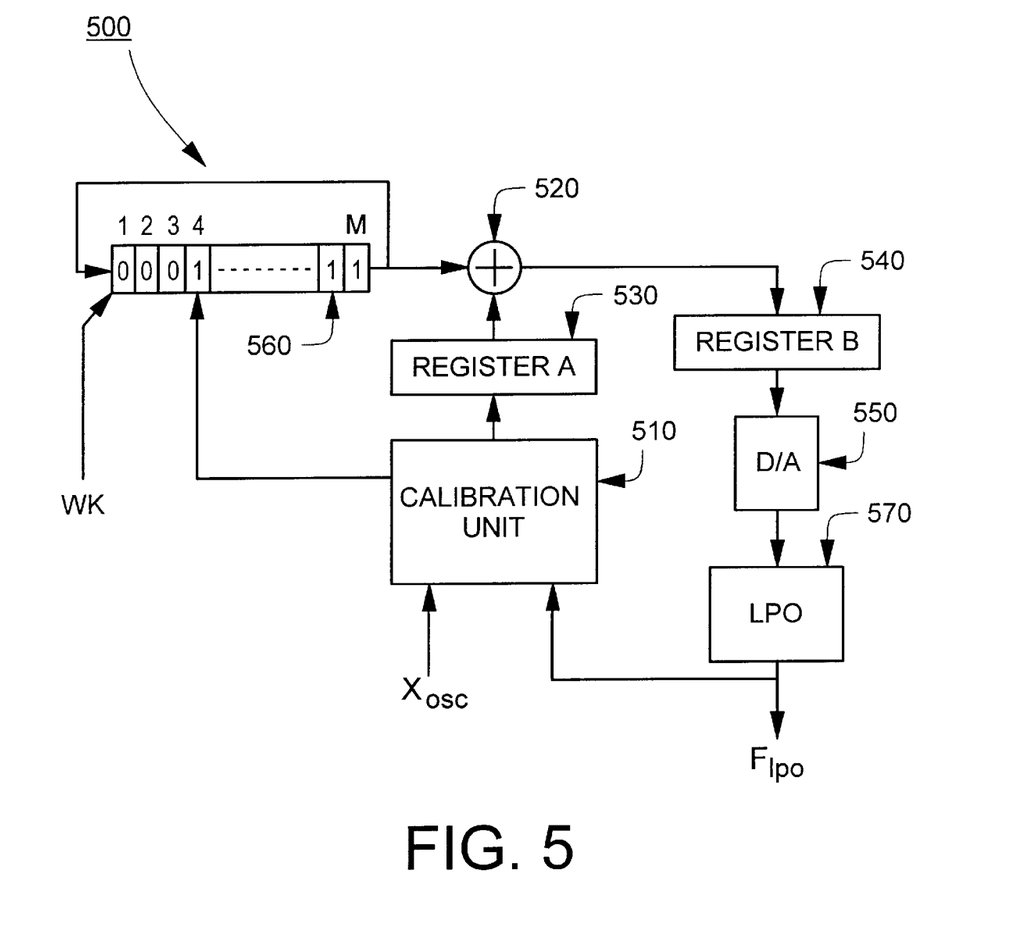
FIG. 5 illustrates an exemplary embodiment of a calibrated LPO according to the present invention.

A first embodiment of the calibration method is illustrated by FIG. 5. Register A 530 contains an initial offset value OV which can be adjusted by the calibration unit 510 at the end of every calibration cycle.

To the initial offset value, a one or a zero is added as a least significant bit (LSB) at block 520. The result of this addition is stored as a temporary LPO control word in register B 540. The contents of register B 540 corresponds to the control word E in FIG. 4 The LPO control word is valid for one subcycle of the calibration cycle. The addition of a one or a zero for any given subcycle is determined by the most significant bit of the rotating buffer 560 at each subcycle. That is, the rotating buffer is advanced at the rate of the subcycles (i.e., the wake-up rate). The contents of the buffer 560 determine whether the control word remains constant or is incremented by 1 (i.e., OV or OV+1). Thus, the offset value toggles between two integer values. The calibration unit 510 monitors the frequency of the LPO and computes the average $f_{LPO}$.

A signal WK, which controls the wake-up event, advances the rotating buffer 560 and enables the registers 530 and 540. When, after the calibration cycle, the average LPO frequency is found by the calibration unit 510 to be too low, a zero in the rotating buffer 560 is changed to a one. In contrast, when the LPO frequency is found to be too high, a one in the buffer 560 is changed to a zero. This will balance the number of ones and zeroes in the buffer 560 until the desired average LPO frequency is obtained. It is most efficient if the buffer is filled with 1s from the beginning and a pointer is used to track the position of the last "1". In this manner, 1s can be readily added or deleted by calibration unit 510. The modification of the rotating buffer's contents can be performed once at the end of the calibration cycle, i.e., after M shifts, when the position of the bits in the rotating buffer 560 are the same as at the beginning of the calibration cycle. If the buffer contains all ones (1s), the contents of register A 530 should be incremented by one so that OV=OV+1. The buffer 560 does not have to be reset; zeroes will be added automatically if it appears that the frequency is too high. If the buffer contains all zeroes, the contents of register A 530 is decremented so that OV=OV−1. Note that the concept as illustrated by FIG. 5 provides a non-integer control signal to the LPO where the integer part resides as OV in register A 530 and the fractional part resides in the rotating buffer 560 as a sequence of 1s and 0s (ones and zeroes).

Figure 6:
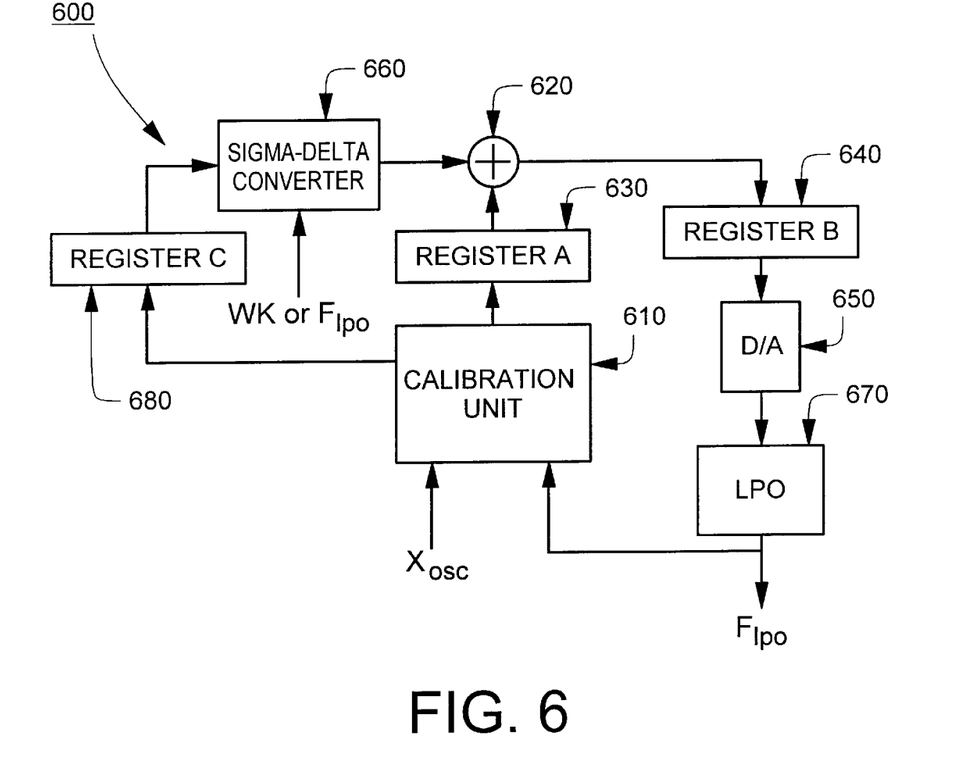
FIG. 6 illustrates another exemplary embodiment of a calibrated LPO according to the present invention.

A second embodiment of the invention is illustrated in FIG. 6. As illustrated by FIG. 5, there is a calibration unit 610, a register A 630 for storing the initial offset value OV, and a register B 640 for storing the LPO control word. However, instead of the rotating buffer 560, a sigma-delta converter unit 660 is used which provides the fractional part of the non-integer LPO control signal. This unit 660 is driven by a correction signal from the calibration unit 610 and stored in register C 680. The correction signal is the difference between the initial value in register A and the desired LPO control signal. The sigma-delta unit 660 adds 1s or 0s to the value OV according to the value of its input signal. It can also add 1s, 0s, and −1s if a multi-level sigma-delta converter is used. The sigma-delta unit is sampled with WK or with the clock signal of the LPO clock itself.

In the above-described embodiments, the new correction value was determined in the calibration unit once after each calibration cycle based on the accumulated result of the M monitoring windows. However, it is also possible to use a moving accumulated method where after each subcycle a new correction value is determined in the calibration unit based on the last M monitoring windows.

The present invention has been described in terms of specific embodiments to facilitate understanding. The above embodiments, however, are illustrative rather than restrictive. It will be readily apparent to one skilled in the art that departures may be made from the specific embodiments shown above without departing from the central spirit and scope of the invention. Therefore, the invention should not be regarded as being limited to the above examples, but should be regarded instead as being fully commensurate in scope with the following claims.

What is claimed is:

1. A method for controlling an oscillator comprising the steps of:

counting the number of output cycles of the oscillator during each of a first plurality of monitoring windows;

accumulating the counted output cycles; and determining an output cycle correction signal to be applied to the oscillator for a second plurality of monitoring periods based on the accumulated output cycles wherein the second plurality of monitoring windows follows the first plurality of monitoring windows.

2. The method of claim 1 wherein the determined correction signal is applied to the oscillator during the second plurality of monitoring windows and wherein further the correction signal is constant during the second plurality of monitoring windows.

3. The method of claim 1 further comprising the steps of:

counting the number of output cycles of the oscillator during each of the second plurality of monitoring windows;

accumulating the counted output cycles for the second plurality of monitoring windows; and determining an output cycle correction signal to be applied to the oscillator for a third plurality of monitoring windows based on the accumulated output cycles for the second plurality of monitoring windows.

4. The method of claim 3 wherein the third plurality of monitoring windows follows the second plurality of monitoring windows.

5. The method of claim 4 wherein the correction signal determined during the second plurality of monitoring windows is applied to the oscillator during the third plurality of monitoring windows and wherein further the correction signal is constant during the third plurality of monitoring windows.

6. The method of claim 5 wherein the correction signal applied during the second plurality of monitoring-windows is different from the correction signal applied during the third plurality of monitoring windows.

7. The method of claim 1 wherein an improvement in the accuracy of the oscillator resulting from applying the correction signal corresponds to the number of monitoring windows.

8. The method of claim 7 wherein the accuracy of the oscillator is further improved by applying a correction signal that is toggled between at least two discrete values.

9. The method of claim 1 wherein a reduction in a duration of each of the monitoring windows reduces the power consumption of the oscillator.

10. The method of claim 1 wherein the oscillator is a low power oscillator.

11. The method of claim 1 wherein the first plurality of monitoring windows comprise a calibration cycle which includes:

a plurality of wake-up periods; and a plurality of sleep periods, each corresponding to one of said wake-up periods, wherein each wake-up period and a corresponding sleep period comprise a subcycle which has a constant correction value associated therewith.

12. A calibration method for tuning an oscillator comprising the steps of:

storing an initial offset value in a first register, said value being modified at an end of a calibration cycle;

adding a predetermined value to said offset value and storing a result of said addition as a temporary control word in a second register, the temporary control word being valid for one subcycle; and using the temporary control word to correct output cycles of said oscillator wherein a subcycle comprises a wake-up period and a corresponding sleep period and wherein further a plurality of subcycles comprise a calibration cycle.

13. The method of claim 12 wherein the added value is determined by a rotating buffer.

14. The method of claim 13 wherein said rotating buffer comprises a plurality of registers each containing as values one of a one and a zero.

15. The method of claim 13 wherein the buffer is enabled by a wake-up signal.

16. The method of claim 13 wherein the buffer is shifted by one at an end of each of said subcycles.

17. The method of claim 12 wherein said control word is one of said initial offset value and said offset value plus one.

18. The method of claim 12 wherein the added value is determined by a sigma-delta converter.

19. The method of claim 18 wherein the added value is one of a one and a zero.

20. The method of claim 18 wherein said sigma-delta converter is enabled by a correction signal from a calibration unit stored in a third register.

21. The method of claim 12 wherein said control word is one of said offset value and said offset value plus one.

22. The method of claim 12 wherein the added value is determined by a sigma-delta converter.

23. The method of claim 22 wherein the added value is one of a one, a zero and a minus one.

24. The method of claim 22 wherein said sigma-delta converter is enabled by a correction signal from a calibration unit stored in a third register.

25. The method of claim 12 wherein the temporary control word is one of said offset value, said offset value plus one and said offset value minus one.

26. A calibration method for tuning an oscillator comprising the steps of:

storing an initial offset value in a first register, said value being modified at an end of a calibration cycle;

adding a predetermined value to said offset value and storing a result of said addition as a temporary control word in a second register, the temporary control word being valid for one subcycle;

accumulating output cycles of said oscillator for each subcycle and computing an average output cycle at an end of a calibration cycle wherein a subcycle comprises a wake-up period and a corresponding sleep period and wherein further a plurality of subcycles comprise a calibration cycle; and adjusting said output cycles of said oscillator based on a result of said average output cycle computation.

27. The method of claim 26 wherein the added bit is determined by a rotating buffer.

28. The method of claim 27 wherein said rotating buffer comprises a plurality of registers each containing as values one of a one and a zero.

29. The method of claim 27 wherein the buffer is enabled by a wake-up signal.

30. The method of claim 27 wherein the buffer is shifted at an end of each of said subcycles.

31. The method of claim 26 wherein said control word is one of said offset value and said offset value plus one.

32. The method of claim 26 wherein if the accumulated value is higher than a preset value, a value of one of said registers containing a one is changed to a zero.

33. The method of claim 26 wherein if the accumulated value is lower than a preset value, a value of one of said registers containing a zero is changed to a one.

* * * * *